(12) United States Patent
Kobayashi et al.

(10) Patent No.: US 11,901,158 B2
(45) Date of Patent: Feb. 13, 2024

(54) PLASMA PROCESSING METHOD, PLASMA PROCESSING APPARATUS, AND CONTROL APPARATUS

(71) Applicant: Tokyo Electron Limited, Tokyo (JP)

(72) Inventors: Takeshi Kobayashi, Tokyo (JP); Hiroyuki Kikuchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 312 days.

(21) Appl. No.: 17/241,885

(22) Filed: Apr. 27, 2021

(65) Prior Publication Data

US 2021/0351010 A1 Nov. 11, 2021

(30) Foreign Application Priority Data

May 11, 2020 (JP) .................. 2020-083484

(51) Int. Cl.
| | |
|---|---|
| *H01L 21/02* | (2006.01) |
| *C23C 16/40* | (2006.01) |
| *H01J 37/32* | (2006.01) |
| *H01L 21/687* | (2006.01) |

(Continued)

(52) U.S. Cl.
CPC ...... *H01J 37/32146* (2013.01); *C23C 16/401* (2013.01); *C23C 16/4584* (2013.01); *C23C 16/45536* (2013.01); *H01J 37/3244* (2013.01); *H01J 37/32715* (2013.01); *H01L 21/0228* (2013.01); *H01L 21/02164* (2013.01); *H01L 21/02274* (2013.01); *H01L 21/68764* (2013.01);

(Continued)

(58) Field of Classification Search
None
See application file for complete search history.

(56) References Cited

U.S. PATENT DOCUMENTS

2015/0126044 A1* 5/2015 Kato .................. C23C 16/505 118/723 R
2019/0180985 A1* 6/2019 Tanaka ............ C23C 16/45519

FOREIGN PATENT DOCUMENTS

| JP | 2014-222657 A | 11/2014 |
|---|---|---|
| JP | 2017-531921 A | 10/2017 |

(Continued)

OTHER PUBLICATIONS

Shinohara et al., "Trials of RF plasma production using different antenna geometries with magnetic field", 1998 Plasma Phys. Control. Fusion 40, 2081. (Year: 1998).*

*Primary Examiner* — Asok K Sarkar
(74) *Attorney, Agent, or Firm* — Venjuris, P.C.

(57) ABSTRACT

A plasma processing method includes providing a plasma processing apparatus including a rotary table that is rotatably provided in a vacuum container and disposes a plurality of substrates on an upper surface along a circumferential direction, a gas supply source that supplies a plasma processing gas to at least one of a plurality of processing areas separated by a separation area in the circumferential direction of the rotary table, and an antenna that is provided to face the upper surface of the rotary table and generates plasma in the at least one processing area. The plasma processing method further includes disposing the plurality of substrates on the rotary table, and supplying the plasma processing gas into the vacuum container and supplying a pulsed wave of RF power to the antenna while rotating the rotary table.

4 Claims, 11 Drawing Sheets

(51) Int. Cl.
*C23C 16/458* (2006.01)
*C23C 16/455* (2006.01)

(52) U.S. Cl.
CPC ............... *H01J 2237/20214* (2013.01); *H01J 2237/332* (2013.01)

(56) References Cited

FOREIGN PATENT DOCUMENTS

| | | |
|---|---|---|
| JP | 2018-139256 A | 9/2018 |
| JP | 2020-004971 A | 1/2020 |

* cited by examiner

PLASMA PROCESSING METHOD, PLASMA PROCESSING APPARATUS, AND CONTROL APPARATUS

CROSS-REFERENCE TO RELATED APPLICATION

This application is based on and claims priority from Japanese Patent Application No. 2020-083484 filed on May 11, 2020 with the Japan Patent Office, the disclosure of which is incorporated herein in its entirety by reference.

TECHNICAL FIELD

The present disclosure relates to a plasma processing method, a plasma processing apparatus, and a control apparatus.

BACKGROUND

A film forming apparatus is known in which a rotating table is provided in a vacuum container to dispose and rotate a plurality of substrates thereon, and a plasma processing gas is supplied into the vacuum container to turn the plasma processing gas into plasma by a plasma generation unit, thereby performing a plasma processing (see, e.g., Japanese Patent Laid-Open Publication No. 2018-139256). In the film forming apparatus, a distance between the plasma generation unit and the rotary table is changed by changing the position of an arrangement height of the plasma generation unit, and a stable plasma is formed to perform the plasma processing.

SUMMARY

A plasma processing method according to an embodiment of the present disclosure performs a plasma processing on a plurality of substrates using a plasma processing apparatus. The plasma processing apparatus includes a rotary table that is rotatably provided in a vacuum container and places the plurality of substrates on an upper surface thereof along a circumferential direction, a plasma processing gas supply that supplies a plasma processing gas to at least one of a plurality of processing areas separated by a separation area in the circumferential direction of the rotary table, and an antenna that is provided to face the upper surface of the rotary table and generates plasma in the at least one processing area. The plasma processing method includes placing the plurality of substrates on the rotary table, and supplying the plasma processing gas into the vacuum container and supplying a pulsed wave of RF power while rotating the rotary table.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
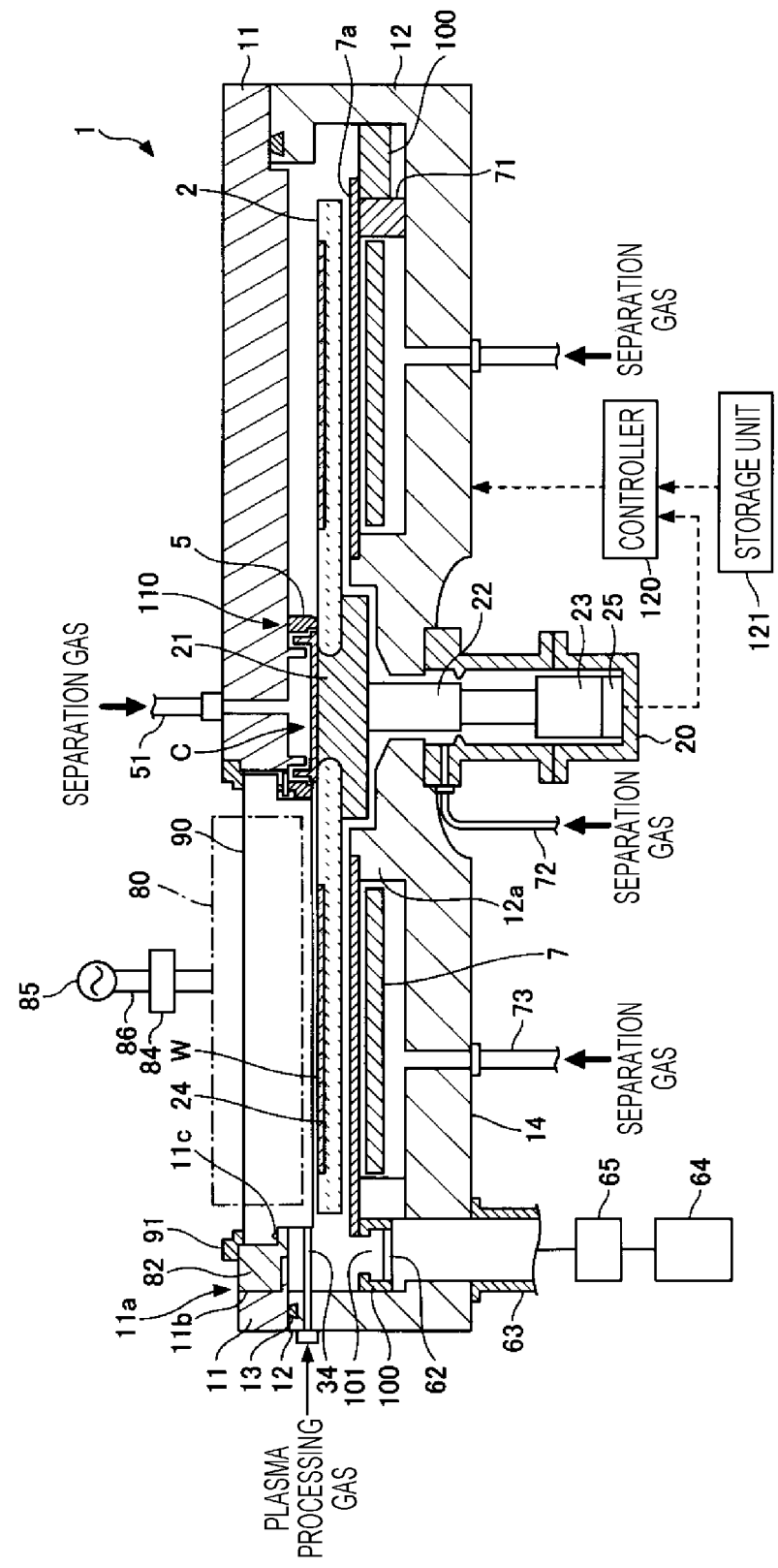
FIG. 1 is a cross-sectional view illustrating a configuration example of a plasma processing apparatus of an embodiment.

In the following detailed description, reference is made to the accompanying drawing, which form a part thereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

[Plasma Processing Apparatus]

Figure 2:
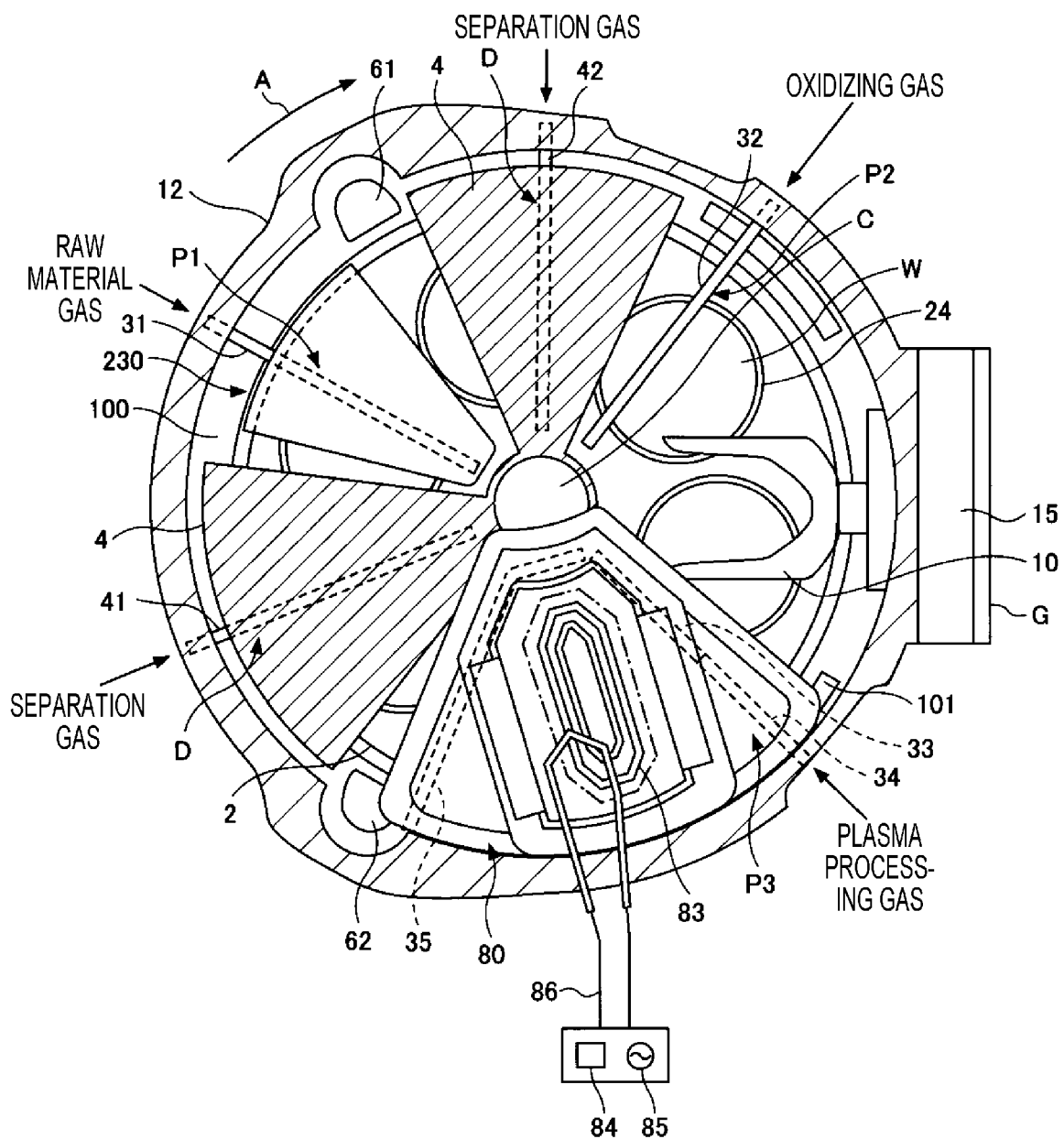
FIG. 2 is a plan view of the plasma processing apparatus of FIG. 1.

A configuration example of a plasma processing apparatus of the embodiment will be described with reference to FIGS. 1 to 10. FIG. 1 is a cross-sectional view illustrating a configuration example of the plasma processing apparatus of the embodiment. FIG. 2 is a plan view of the plasma processing apparatus of FIG. 1. FIG. 2 does not illustrate a ceiling plate 11 for convenience of explanation.

As illustrated in FIG. 1, the plasma processing apparatus includes a vacuum container 1 having a substantially circular planar shape, and a rotary table 2 provided in the vacuum container 1, having a rotation center at the center of the vacuum container 1, and configured to revolve wafers W.

The vacuum container 1 is a processing chamber that accommodates the wafer W to perform a film forming process and deposit a thin film on the surface of the wafer W. The vacuum container 1 includes a ceiling plate 11 provided at a position facing a recess 24 (to be described later) in the rotary table 2, and a container body 12. A sealing member 13 provided in an annular shape is provided on the peripheral edge of the upper surface of the container body 12. The ceiling plate 11 is configured to be removable from the container body 12. The diameter dimension (inner diameter dimension) of the vacuum container 1 in a plan view is not limited, but may be, for example, about 1,100 mm.

A separation gas supply pipe 51 for supplying a separation gas is connected to the central portion on the upper surface of the vacuum container 1 in order to suppress different processing gases from being mixed with each other in a central area C in the vacuum container 1.

The rotary table 2 is fixed to a core portion 21 having a substantially cylindrical shape at the central portion, and is rotatably configured by a driving unit 23 around the vertical axis (i.e., clockwise in the example illustrated in FIG. 2) with respect to a rotary shaft 22 which is connected to the lower surface of the core portion 21 and extends in the vertical direction. The diameter dimension of the rotary table 2 is not limited, but may be, for example, about 1,000 mm.

The driving unit 23 is provided with an encoder 25 that detects the rotation angle of the rotary shaft 22. In the embodiment, the rotation angle of the rotary shaft 22 detected by the encoder 25 is transmitted to a controller 120 and is used to specify the position of the wafer W placed in each recess 24 on the rotary table 2 by the controller 120.

The rotary shaft 22 and the driving unit 23 are accommodated in a case body 20. In the case body 20, a flange portion on the upper surface is airtightly attached to the lower surface of the bottom 14 of the vacuum container 1. A purge gas supply pipe 72 for supplying Ar gas as a purge gas (separation gas) is connected to a lower area of the rotary table 2 to the case body 20.

The outer periphery of the core portion 21 of the bottom 14 of the vacuum container 1 is formed in an annular shape to approach the rotary table 2 from the lower portion to form a protruding portion 12a.

A circular recess 24 on which a wafer W having a diameter of, for example, 300 mm may be placed is formed on the surface of the rotary table 2. The recess 24 is provided at each of a plurality of, for example, six positions along the rotation direction of the rotary table 2 (i.e., the direction indicated by the arrow A in FIG. 2). The recess 24 has an inner diameter slightly greater than the diameter of the wafer W, specifically, about 1 mm to 4 mm. The depth of the recess 24 is configured to be substantially equal to or greater than the thickness of the wafer W. Therefore, when the wafer W is accommodated in the recess 24, the surface of the wafer W and the surface of a flat area on which the wafer W of the rotary table 2 is not placed are at the same height, or the surface of the wafer W becomes lower than the surface of the rotary table 2. Further, a through hole (not illustrated) through which, for example, three elevating pins (to be described later) are formed for pushing up and lowering the wafer W from the lower portion, is formed on the lower surface of the recess 24.

As illustrated in FIG. 2, a first processing area P1, a second processing area P2, and a third processing area P3 are provided apart from each other along the rotation direction of the rotary table 2. For example, a plurality of quartz nozzles 31 such as, for example, seven gas nozzles 31 to 35, 41, and 42 are arranged radially at intervals in the circumferential direction of the vacuum container 1 at a position of the rotary table 2 facing the passing area of the recess 24.

Each of the gas nozzles 31 to 35, 41, and 42 is arranged between the rotary table 2 and the ceiling plate 11. Each of the gas nozzles 31 to 34, 41, and 42 is attached to extend horizontally, for example, from the outer peripheral wall of the vacuum container 1 toward the central area C, facing the rotary table 2. Meanwhile, the gas nozzle 35 extends from the outer peripheral wall of the vacuum container 1 toward the central area C, and then bends and extends counterclockwise (i.e., in the direction opposite to the rotation direction of the rotary table 2) to linearly follow the central area C.

In the example illustrated in FIG. 2, plasma processing gas nozzles 33 to 35, a separation gas nozzle 41, a first processing gas nozzle 31, a separation gas nozzle 42, and a second processing gas nozzle 32 are placed in this order in the clockwise direction (i.e., the rotation direction of the rotary table 2) from a transfer port 15 (to be described later). The gas supplied by the second processing gas nozzle 32 has often the same quality as the gas supplied by the plasma processing gas nozzles 33 to 35, but when the plasma processing gas nozzles 33 to 35 are sufficient to supply the gas, such nozzles may not necessarily be provided.

In addition, the plasma processing gas nozzles 33 to 35 may be replaced by a single plasma processing gas nozzle. In this case, for example, similarly to the second processing gas nozzle 32, a plasma processing gas nozzle extending from the outer peripheral wall of the vacuum container 1 toward the central area C may be provided.

The first processing gas nozzle 31 constitutes a first processing gas supply. The second processing gas nozzle 32 constitutes a second processing gas supply. Further, each of the plasma processing gas nozzles 33 to 35 constitutes a plasma processing gas supply. Also, each of the separation gas nozzles 41 and 42 constitutes a separation gas supply.

Each of the gas nozzle 31 to 35, 41, and 42 is connected to each gas supply source (not illustrated) via a flow rate adjusting valve.

Gas ejection holes 36 for ejecting each of the above-mentioned gases are formed at a plurality of positions along the radial direction of the rotary table 2, for example, at equal intervals on the lower surfaces of the gas nozzles 31 to 35, 41, and 42 (i.e., the side facing the rotary table 2). The gas nozzles 31 to 35, 41, and 42 are arranged such that a separation distance between the lower end edge of each of the gas nozzles 31 to 35, 41, and 42 and the upper surface of the rotary table 2 is, for example, about 1 mm to 5 mm.

The lower area of the first processing gas nozzle 31 is a first processing area P1 for adsorbing the raw material gas on the wafer W, and the lower area of the second processing gas nozzle 32 is a second processing area P2 that supplies the wafer W with an oxidizing gas capable of oxidizing the raw material gas to generate an oxide. Further, the lower area of the plasma processing gas nozzles 33 to 35 becomes a third processing area P3 for modifying a film on the wafer W.

The first processing gas nozzle 31 supplies a silicon-containing gas when forming a silicon oxide film or a silicon nitride film, and supplies a metal-containing gas when forming a metal oxide film or a metal nitride film. As described above, the first processing gas nozzle 31 is a nozzle for supplying the raw material gas (precursor) containing the raw material which is the main component of the thin film. Therefore, the first processing gas nozzle 31 is also referred to as a raw material gas nozzle 31. Further, since the first processing area P1 is an area for adsorbing the raw material gas on the wafer W, the area is also referred to as a raw material gas adsorption area P1.

Similarly, the second processing gas nozzle 32 is also referred to as an oxidizing gas nozzle 32 because the nozzle supplies an oxidizing gas such as oxygen, ozone, water, and hydrogen peroxide to the wafer W when the oxide film is formed. Further, since the second processing area P2 is an area where the oxidizing gas is supplied to the wafer W on which the raw material gas is adsorbed in the first processing area P1 to oxidize the raw material gas adsorbed on the wafer W, the second processing area P2 is also referred to as an oxidation area P2. In the oxidation area P2, the molecular layer of the oxide film is deposited on the wafer W.

Similarly, the third processing area P3 is also referred to as a plasma processing area P3 because the area is an area where the molecular layer of the oxide film formed in the second processing area P2 is plasma processed to modify the oxide film. In the embodiment, since the oxide film is formed, the plasma processing gas supplied from the plasma processing gas nozzles 33 to 35 is, for example, an oxygen-containing gas. However, when the nitride film is formed, the plasma processing gas supplied from the plasma processing gas nozzles 33 to 35 is, for example, a nitrogen-containing gas.

The separation gas nozzles 41 and 42 are provided to form a separation area D that separates the first processing area P1 and the second processing area P2, and the third processing area P3 and the first processing area P1. The separation gas supplied from the separation gas nozzles 41 and 42 is an inert gas such as nitrogen, or a rare gas such as helium or argon. Since the separation gas also functions as a purge gas, the separation gas may be referred to as a purge gas, and the separation gas nozzles 41 and 42 are also referred to as purge gas nozzles 41 and 42. A separation area D is not provided between the second processing area P2 and the third processing area P3. This is because the oxidizing gas supplied in the second processing area P2 and the mixed gas supplied in the third processing area P3 commonly contain oxygen atoms in the oxygen gas contained in the mixed gas, and both of such gases function as an oxidant. Therefore, it is not necessary to separate the second processing area P2 and the third processing area P3 from each other by using a separation gas.

Since the plasma processing gas nozzles 33 to 35 have a structure of supplying gas to different areas on the rotary table 2, the flow rate ratio of each component of the mixed gas may be different for each area, and the gas may be supplied so that the modification process is uniformly performed as a whole.

Figure 3:
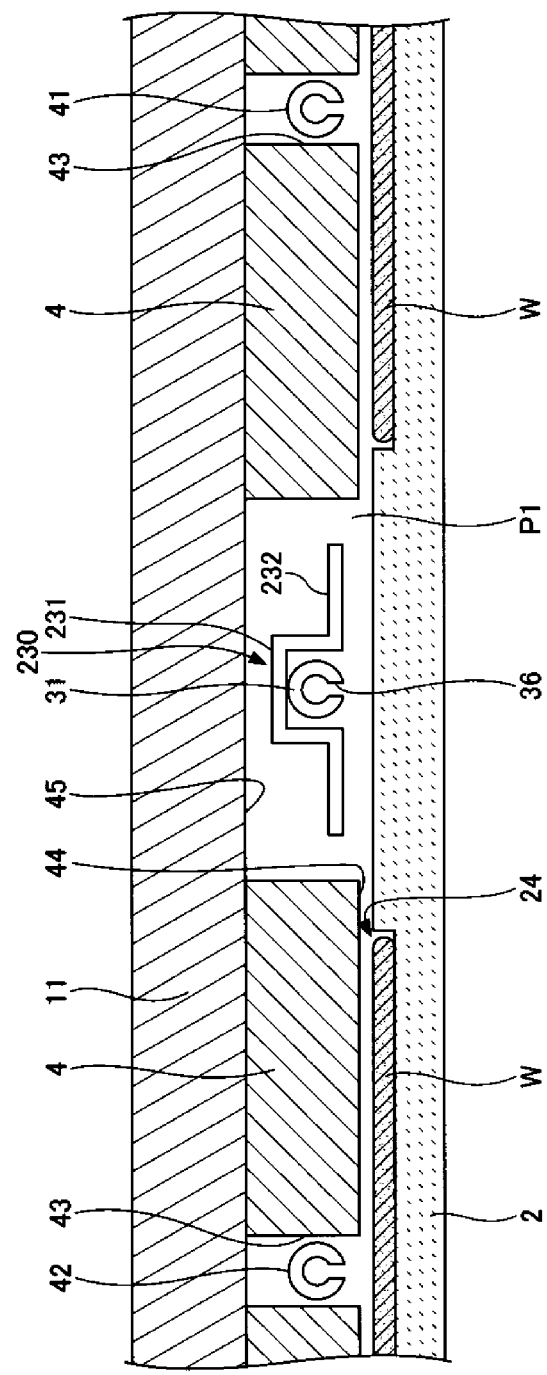
FIG. 3 is a cross-sectional view taken along the concentric circles of a rotary table of the plasma processing apparatus in FIG. 1.

FIG. 3 is a cross-sectional view taken along the concentric circles of the rotary table 2 of the plasma processing apparatus of FIG. 1, and is a cross-sectional view from a separation area D to another separation area D via the first processing area P1.

The ceiling plate 11 of the vacuum container 1 in the separation area D is provided with a substantially fan-shaped convex portion 4. The convex portion 4 is attached to the back surface of the ceiling plate 11. A flat low ceiling surface that is the lower surface of the convex portion 4 (hereinafter, referred to as a "first ceiling surface 44"), and a ceiling surface that is located on both sides of the first ceiling surface 44 in the circumferential direction and is higher than the first ceiling surface 44 (hereinafter, referred to as a "second first ceiling surface 45") is formed inside the vacuum container 1.

As illustrated in FIG. 2, the convex portion 4 forming the first ceiling surface 44 has a fan-shaped planar shape whose top is cut in an arc shape. A groove 43 is formed in the convex portion 4 to extend radially at the center in the circumferential direction. Separation gas nozzles 41 and 42 are accommodated in the groove 43. The peripheral edge of the convex portion 4 (i.e., the portion on the outer edge of the vacuum container 1) is bent in an L shape to face the outer end surface of the rotary table 2 and to be slightly separated from the container body 12 in order to suppress mixing of the processing gases.

A nozzle cover 230 is provided on the upper portion of the first processing gas nozzle 31 so that the first processing gas flows along the wafer W and the separation gas passes through the ceiling plate 11 of the vacuum container 1 while avoiding the vicinity of the wafer W. As illustrated in FIG. 3, the nozzle cover 230 includes a cover body 231 and a straightening plate 232. The cover body 231 has a substantially box shape in which the lower surface is opened to accommodate the first processing gas nozzle 31. The straightening plate 232 is a plate-like body connected to the upstream side and the downstream side in the rotation direction of the rotary table 2 at the lower opening end of the cover body 231, respectively. The side wall surface of the cover body 231 on the rotation center of the rotary table 2 extends toward the rotary table 2 to face the tip end portion of the first processing gas nozzle 31. Further, the side wall surface of the cover body 231 on the outer edge of the rotary table 2 is cut out so as not to interfere with the first processing gas nozzle 31. The nozzle cover 230 is not essential and may be provided as needed.

As illustrated in FIG. 2, a plasma source 80 is provided on the upper portion of the plasma processing gas nozzles 33 to 35 in order to turn the plasma processing gas ejected into the vacuum container 1 into plasma. The plasma source 80 uses an antenna 83 to generate inductively coupled plasma.

Figure 4:
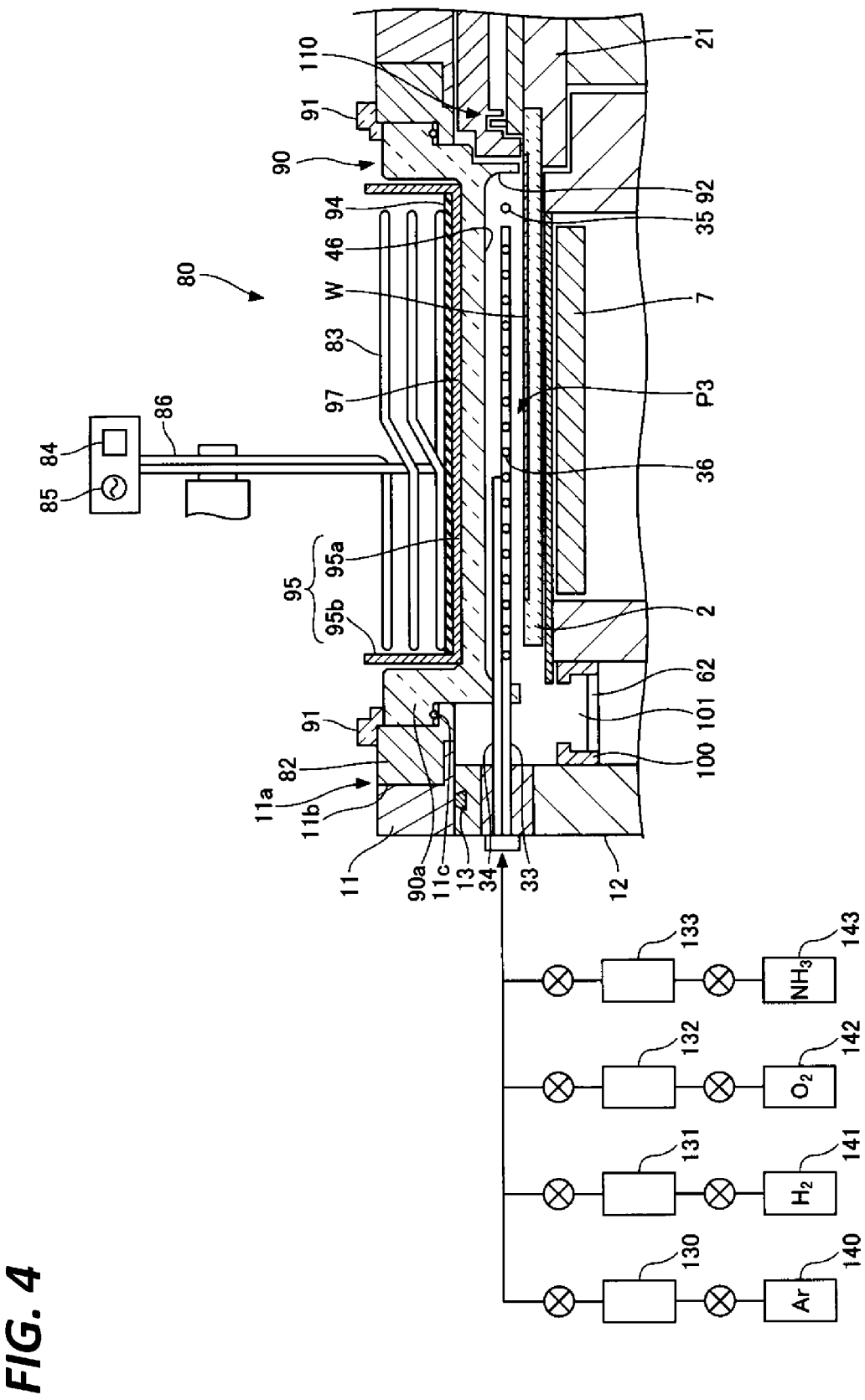
FIG. 4 is a cross-sectional view of a plasma source provided in the plasma processing apparatus of FIG. 1.
Figure 5:
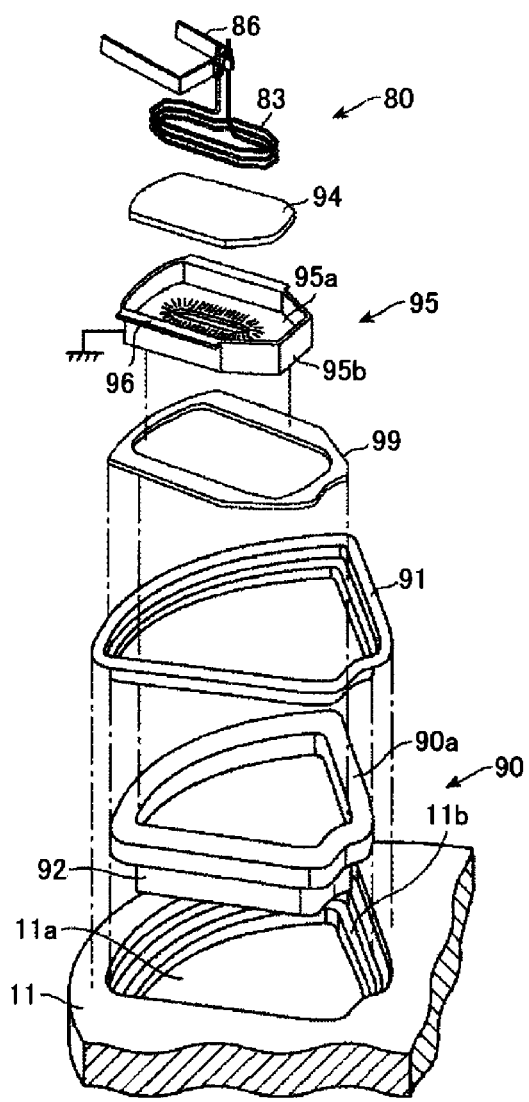
FIG. 5 is an exploded perspective view of a plasma source provided in the plasma processing apparatus of FIG. 1.
Figure 6:
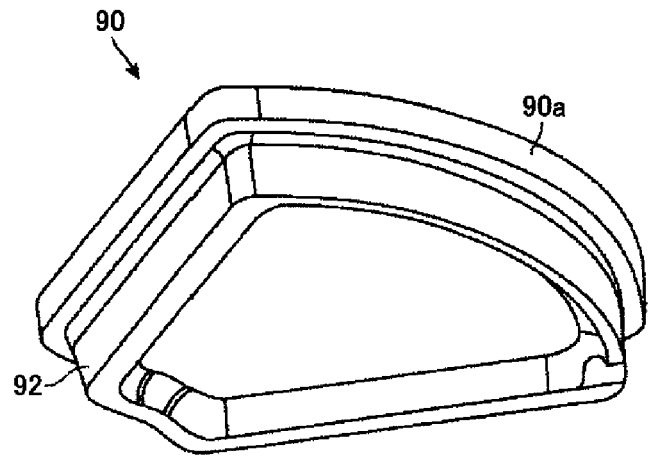
FIG. 6 is a perspective view of an example of a housing provided in the plasma source of FIG. 5.

FIG. 4 is a cross-sectional view of a plasma source 80 provided in the plasma processing apparatus of FIG. 1. FIG. 5 is an exploded perspective view of the plasma source 80 provided in the plasma processing apparatus of FIG. 1. FIG. 6 is a perspective view of an example of a housing 90 provided in the plasma source 80 of FIG. 5.

The plasma source 80 is configured by winding an antenna 83 formed of a metal wire in a coil shape three times, for example, around a vertical axis. Further, the plasma source 80 is arranged to surround the strip-shaped area extending in the radial direction of the rotary table 2 in a plan view and to straddle the diameter portion of the wafer W on the rotary table 2.

The antenna 83 is connected to an RF power supply 85 having a frequency of, for example, 13.56 MHz via a matching unit 84. The antenna 83 is provided to be airtightly partitioned from the internal area of the vacuum container 1. In FIGS. 4 and 5, a connection electrode 86 for electrically connecting the antenna 83, the matching unit 84, and the RF power supply 85 is provided.

The antenna 83 may be provided with a structure that may be bent up and down, a vertical movement mechanism that may automatically bend the antenna 83 up and down, and a mechanism that may move a portion of the center of the rotary table 2 up and down, if necessary. In FIG. 4, those configurations are omitted.

As illustrated in FIGS. 4 and 5, the ceiling plate 11 on the upper portion of the plasma processing gas nozzles 33 to 35 is formed with an opening 11a that opens substantially in a fan shape in a plan view.

As illustrated in FIG. 4, the opening 11a has an annular member 82 that is airtightly provided in the opening 11a along the opening edge of the opening 11a. The housing 90, which will be described later, is airtightly provided on the inner peripheral surface of the annular member 82. That is, the annular member 82 is airtightly provided with the outer periphery in contact with the inner peripheral surface 11b of the opening 11a of the ceiling plate 11 and the inner periphery in contact with a flange portion 90a of the housing 90 (to be described later). Then, in order to position the antenna 83 below the ceiling plate 11, a housing 90 made of a derivative such as quartz is provided in the opening 11a via the annular member 82. The bottom surface of the housing 90 constitutes a ceiling surface 46 of the plasma processing area P3.

As illustrated in FIG. 6, the housing 90 is formed such that the upper peripheral edge thereof extends horizontally in a flange shape over the circumferential direction to form the flange portion 90a, and the central portion thereof is recessed toward the inner area of the vacuum container 1 on the lower portion in a plan view.

The housing 90 is arranged to straddle the diameter portion of the wafer W in the radial direction of the rotary table 2 when the wafer W is located below the housing 90. A sealing member 11c such as an O-ring is provided between the annular member 82 and the ceiling plate 11 (see, e.g., FIG. 4).

The internal atmosphere of the vacuum container 1 is airtightly set via the annular member 82 and the housing 90. Specifically, the annular member 82 and the housing 90 are fitted into the opening 11a, and then on the upper surface of the annular member 82 and the housing 90, the housing 90 is pressed downward in the circumferential direction by a pressing member 91 formed in a frame shape along the contact portion between the annular member 82 and the housing 90. Further, the pressing member 91 is fixed to the ceiling plate 11 with bolts (not illustrated). As a result, the internal atmosphere of the vacuum container 1 is set to be airtight. In FIG. 5, the annular member 82 is omitted for simplification of the illustration.

As illustrated in FIG. 6, a protrusion 92 extending vertically toward the rotary table 2 is formed on the lower surface of the housing 90 to surround the plasma processing area P3 on the lower portion of the housing 90 along the circumferential direction. The plasma processing gas nozzles 33 to 35 described above are housed in an area surrounded by the inner peripheral surface of the protrusion 92, the lower surface of the housing 90, and the upper surface of the rotary table 2. The protrusion 92 at the base end portion (inner wall of the vacuum container 1) of the plasma processing gas nozzles 33 to 35 is cut out in a substantially arc shape along the outer shape of the plasma processing gas nozzles 33 to 35.

As illustrated in FIG. 4, the protrusion 92 is formed on the lower portion (plasma processing area P3) of the housing 90 in the circumferential direction. The sealing member 11c is not directly exposed to the plasma by the protrusion 92, that is, is isolated from the plasma processing area P3. Therefore, even when the plasma is to be diffused from the plasma processing area P3 toward, for example, the sealing member 11c, the plasma goes through the lower portion of the protrusion 92, so that the plasma is deactivated before reaching the sealing member 11c.

Further, as illustrated in FIG. 4, the plasma processing gas nozzles 33 to 35 are provided in the third processing area P3 below the housing 90 and are connected to an argon gas supply source 140, a hydrogen gas supply source 141, an oxygen gas supply source 142, and an ammonia gas supply source 143. However, either one of the hydrogen gas supply source 141 and the ammonia gas supply source 143 may be provided, and it is not always necessary that both of the gas supply sources are provided.

In addition, flow rate controllers 130 to 133 are provided corresponding to the plasma processing gas nozzles 33 to 35, the argon gas supply source 140, the hydrogen gas supply source 141, the oxygen gas supply source 142, and the ammonia gas supply source 143, respectively. The argon gas supply source 140, the hydrogen gas supply source 141, the oxygen gas supply source 142, and the ammonia gas supply source 143 supply Ar gas, $H_2$ gas, $O_2$ gas, and $NH_3$ gas, respectively, to the plasma processing gas nozzles 33 to 35. The flow rates of Ar gas, $H_2$ gas, $O_2$ gas, and $NH_3$ gas are controlled by the flow rate controllers 130 to 133, respectively, and are supplied to the plasma processing gas nozzles 33 to 35 at a predetermined flow rate ratio (mixing ratio). However, as described above, when only one of the hydrogen gas supply source 141 and the ammonia gas supply source 143 is provided, the flow rate controllers 131 and 133 are also provided according to one of the provided ones. As for the flow rate controllers 130 to 133, for example, a mass flow controller may be used.

When there is one plasma processing gas nozzle, for example, the above-mentioned Ar gas and $H_2$ gas, or a mixed gas of $NH_3$ gas and $O_2$ gas is supplied to one plasma processing gas nozzle.

Figure 7:
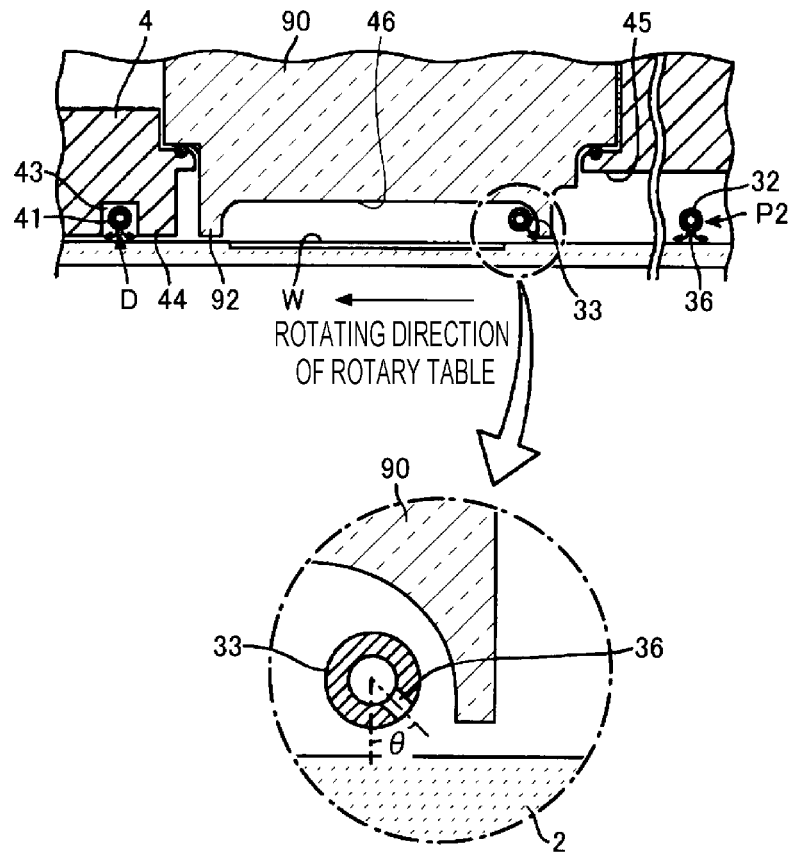
FIG. 7 is another cross-sectional view of a plasma source provided in the plasma processing apparatus of FIG. 1.

FIG. 7 is another cross-sectional view of the plasma source 80 provided in the plasma processing apparatus of FIG. 1, and is a vertical cross-sectional view of the vacuum container 1 cut along the rotation direction of the rotary table 2. As illustrated in FIG. 7, since the rotary table 2 rotates clockwise during the plasma processing, Ar gas is accompanied by the rotation of the rotary table 2 and tries to enter the lower portion of the housing 90 through a gap between the rotary table 2 and the protrusion 92. Therefore, in order to suppress Ar gas from entering the lower portion of the housing 90 through the gap, gas is ejected from the lower portion of the housing 90 with respect to the gap. Specifically, as illustrated in FIGS. 4 and 7, the gas ejection hole 36 of the plasma processing gas nozzle 33 is arranged to face the gap, that is, to face upstream and downward in the rotation direction of the rotary table 2. The angle θ of the gas ejection hole 36 of the plasma processing gas nozzle 33 with respect to the vertical axis may be, for example, about 45° as illustrated in FIG. 7, or may be about 90° to face the inner side surface of the protrusion 92. That is, the angle θ of the gas ejection hole 36 may be set within a range of about 45° to 90°, which may appropriately suppress the intrusion of Ar gas, depending on the application.

Figure 8:
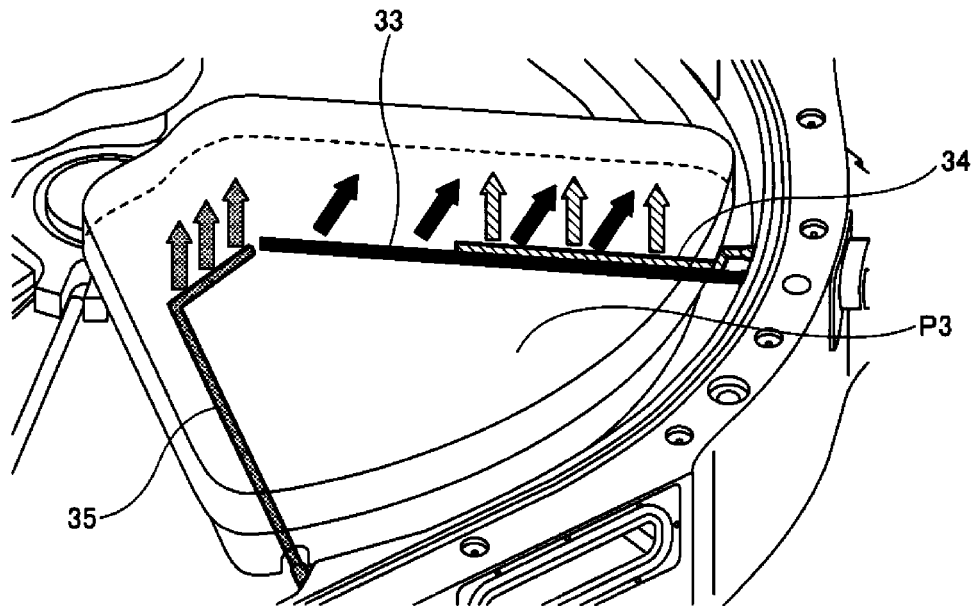
FIG. 8 is an enlarged perspective view illustrating a plasma processing gas nozzle provided in a plasma processing area.

FIG. 8 is an enlarged perspective view of the plasma processing gas nozzles 33 to 35 provided in the plasma processing area P3. As illustrated in FIG. 8, the plasma processing gas nozzle 33 is a nozzle that may cover the entire recess 24 in which the wafer W is arranged and may supply the plasma processing gas to the entire surface of the wafer W. Meanwhile, the plasma processing gas nozzle 34 has a length of about half that of the plasma processing gas nozzle 33 and is provided slightly above the plasma processing gas nozzle 33 so as to substantially overlap the plasma processing gas nozzle 33. Further, the plasma processing gas nozzle 35 extends from the outer peripheral wall of the vacuum container 1 along the radius on the downstream side in the rotation direction of the rotary table 2 of the fan-shaped plasma processing area P3, and has a shape that is linearly bent along the central area C when the plasma processing gas nozzle 35 reaches the vicinity of the central area C. Hereinafter, for easy distinction, the plasma processing gas nozzle 33 that covers the whole is also referred to as a base nozzle 33, the plasma processing gas nozzle 34 that covers only the outside is referred to as an outer nozzle 34, and the plasma processing gas nozzle 35 extending to the inside is also referred to as a shaft-side nozzle 35.

The base nozzle 33 is a gas nozzle for supplying the plasma processing gas to the entire surface of the wafer W, and as described with reference to FIG. 7, the base nozzle 33 ejects the plasma processing gas toward the protrusion 92 constituting the side surface that partitions the plasma processing area P3.

Meanwhile, the outer nozzle 34 is a nozzle for mainly supplying the plasma processing gas to the outer area of the wafer W.

The shaft-side nozzle 35 is a nozzle for intensively supplying the plasma processing gas to the central area of the wafer W close to the shaft side of the rotary table 2.

When the number of plasma processing gas nozzles is set to one, the base nozzle 33 may be provided alone.

Next, a Faraday shield 95 of the plasma source 80 will be described in more detail. As illustrated in FIGS. 4 and 5, the grounded Faraday shield 95 is accommodated in the upper portion of the housing 90 and configured by a metal plate including, for example, copper, which is a conductive plate-like body formed to roughly follow the internal shape of the housing 90. The Faraday shield 95 includes a horizontal plane 95a that is horizontally fitted along the bottom surface of the housing 90, and a vertical plane 95b that extends upward from the outer end of a horizontal plane 95a in the circumferential direction, and may be configured to have, for example, a substantially hexagon in a plan view.

Figure 9:
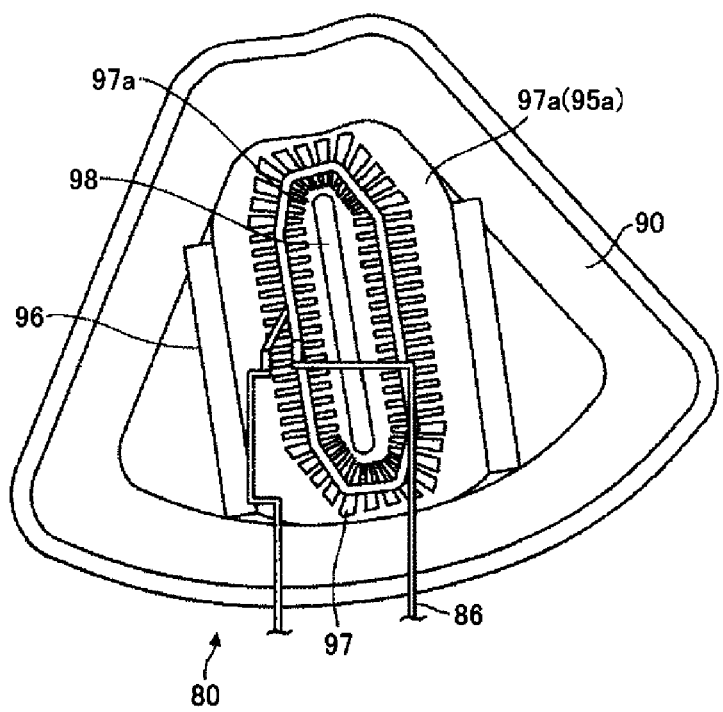
FIG. 9 is a plan view of an example of the plasma source of FIG. 5.
Figure 10:
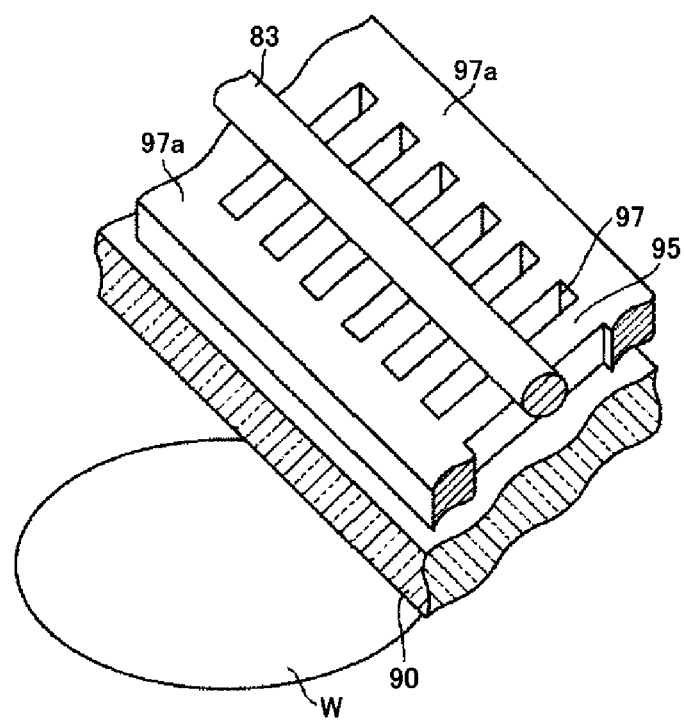
FIG. 10 is a perspective view illustrating a part of a Faraday shield provided in a plasma source.

FIG. 9 is a plan view of an example of the plasma source 80 of FIG. 5, and illustrates an example of the plasma source 80 in which the details of the structure of the antenna 83 and the vertical movement mechanism are omitted. FIG. 10 is a perspective view illustrating a part of the Faraday shield 95 provided in the plasma source 80.

The upper end edges of the Faraday shield 95 on the right side and the left side when the Faraday shield 95 is viewed from the rotation center of the rotary table 2 extend horizontally to the right side and the left side, respectively, to form a support portion 96. A frame shape 99 is provided between the Faraday shield 95 and the housing 90 that supports the support portion 96 from below and is supported by on the central area C of the housing 90 and the flange portion 90a of the outer edge portion of the rotary table 2, respectively (see, e.g., FIG. 5).

When the electric field reaches the wafer W, the electrical wiring formed inside the wafer W may be electrically damaged. Therefore, as illustrated in FIG. 10, multiple slits 97 are formed on the horizontal plane 95a in order to suppress the electric field component of the electric field and the magnetic field (electromagnetic field) generated in the antenna 83 from heading toward the lower wafer W and to allow the magnetic field to reach the wafer W.

As illustrated in FIGS. 9 and 10, the slits 97 are formed at a position below the antenna 83 in the circumferential direction to extend in a direction orthogonal to the winding direction of the antenna 83. The slits 97 are formed to each have a width dimension of about $1/10,000$ or less of the wavelength corresponding to the frequency of the RF power supplied to the antenna 83. Further, a conductive path 97a formed of a grounded conductor is arranged in the circumferential direction on one end and the other end in the longitudinal direction of each slit 97 to close the open end of each slit 97. In the Faraday shield 95, an opening 98 for confirming the light emitting state of plasma is formed in an area outside the formation area of the slits 97, that is, on the center of the wound area of the antenna 83.

As illustrated in FIG. 5, in order to ensure insulation with the plasma source 80 placed above the Faraday shield 95, an insulating plate 91 formed of quartz having a thickness dimension of, for example, about 2 mm is laminated on the horizontal plane 95a of the Faraday shield 95. That is, the plasma source 80 is arranged to cover the inside of the vacuum container 1 (i.e., the wafer W on the rotary table 2) via the housing 90, the Faraday shield 95, and the insulating plate 94.

Again, other components of the plasma processing apparatus of the embodiment will be described.

As illustrated in FIGS. 1 and 2, a side ring 100, which is a cover body, is arranged on the outer periphery of the rotary table 2 at a position below the rotary table 2. A first exhaust port 61 and a second exhaust port 62 are formed on the upper surface of the side ring 100 to be separated from each other in the circumferential direction. In other words, two exhaust ports are formed on the bottom surface of the vacuum container 1, and the first exhaust port 61 and the second exhaust port 62 are formed on the side ring 100 at positions corresponding to these exhaust ports.

The first exhaust port 61 is formed in a position closer to the separation area D between the first processing gas nozzle 31 and the separation area D located on the downstream side in the rotation direction of the rotary table 2 with respect to the first processing gas nozzle 31. The second exhaust port 62 is formed at a position closer to the separation area D between the plasma source 80 and the separation area D on the downstream side of the rotary table 2 in the rotation direction than the plasma source 80.

The first exhaust port 61 is an exhaust port for exhausting the first processing gas and the separation gas, and the second exhaust port 62 is an exhaust port for exhausting the plasma processing gas and the separation gas. As illustrated in FIG. 1, the first exhaust port 61 and the second exhaust port 62 are each connected to, for example, a vacuum pump 64, which is a vacuum exhaust mechanism, by an exhaust pipe 63 provided with a pressure adjusting unit 65 such as a butterfly valve.

As described above, since the housing 90 is arranged from the central area C to the outer edge, the gas flowing from the upstream side of the rotary table 2 in the rotation direction with respect to the second processing area P2 may be restricted by the housing 90 for the gas flow toward the second exhaust port 62. Therefore, a groove-shaped gas flow path 101 is formed on the upper surface of the side ring 100 on the outer periphery of the housing 90, thereby allowing the gas to flow therethrough.

As illustrated in FIG. 1, the central portion on the lower surface of the ceiling plate 11 is formed in a substantially annular shape in the circumferential direction continuously with a portion on the central area C of the convex portion 4, and a protruding portion 5 is provided to have a lower surface formed at the same height as the lower surface of the convex portion 4 (the first ceiling surface 44). A labyrinth structure 110 for suppressing mixing of various gases with each other in the central area C is arranged above the core portion 21 on the rotation center of the rotary table 2 with respect to the protruding portion 5.

As described above, since the housing 90 is formed up to a position closer to the central area C, the core portion 21 that supports the central portion of the rotary table 2 is formed on the rotation center so that the upper portion of the rotary table 2 avoids the housing 90. Therefore, various gases are more likely to be mixed in the central area C than on the outer edge. Therefore, when the labyrinth structure 110 is formed on the upper portion of the core portion 21, it is possible to obtain the flow path of the gas and suppress the gases from mixing with each other.

As illustrated in FIG. 1, a heater unit 7 serving as a heating mechanism is provided in the space between the rotary table 2 and the bottom 14 of the vacuum container 1. The heater unit 7 has a configuration in which the wafer W on the rotary table 2 may be heated to, for example, about room temperature to 700° C. via the rotary table 2. In FIG. 1, a cover member 71 is provided on the side of the heater unit 7, and a cover member 7a is provided to cover the upper portion of the heater unit 7. Further, on the bottom 14 of the vacuum container 1, purge gas supply pipes 73 for purging the arrangement space of the heater unit 7 are provided at a plurality of positions in the circumferential direction on the lower portion of the heater unit 7.

As illustrated in FIG. 2, the transfer port 15 is formed on the side wall of the vacuum container 1 to deliver the substrate W between a transfer arm 10 and the rotary table 2. The transfer port 15 is configured such that the transfer port may be opened and closed more airtightly than a gate valve G.

The wafers W are delivered to and from the transfer arm 10 at a position facing the transfer port 15 in the recess 24 of the rotary table 2. Therefore, an elevating pin and an elevating mechanism (not illustrated) for pushing up the wafer W from the back surface through the recess 24 are provided at a position corresponding to the delivery position on the lower portion of the rotary table 2.

Further, the plasma processing apparatus of the embodiment includes a controller 120 that includes a computer for controlling the operation of the entire apparatus. A program for performing a substrate processing, which will be described later, is stored in the memory of the controller 120. The program has a group of steps for executing various operations of the apparatus, and is installed in the controller 120 from a storage unit 121, which is a storage medium such as a hard disk, a compact disk, a magneto-optical disk, a memory card, or a flexible disk.

[Plasma Processing Method]

Figure 11:
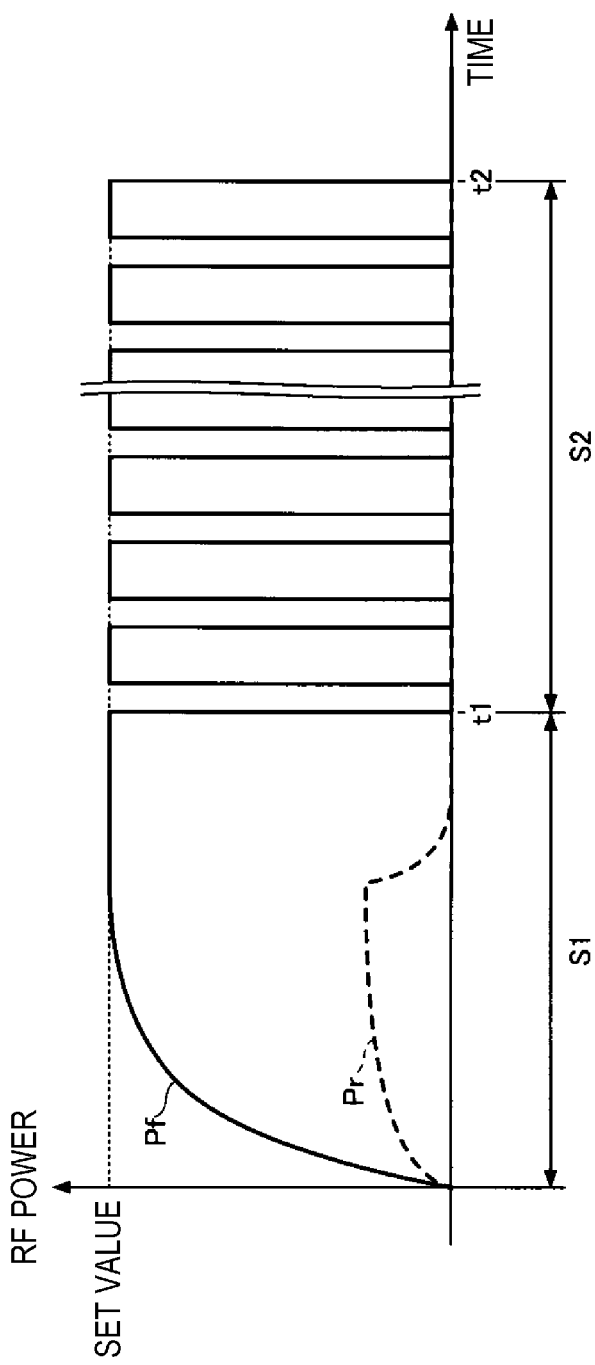
FIG. 11 is a diagram illustrating an example of the output of RF power in a plasma processing method of the embodiment.

With reference to FIG. 11, the plasma processing method of the embodiment will be described by taking, as an example, a case where a thin film is formed by using the above-mentioned plasma processing apparatus. Examples of the thin film that may be formed by the plasma processing method of the embodiment include oxide films such as $SiO_2$, $ZrO_2$, $HfO_2$, $TiO_2$, and $Al_2O_3$, nitride films such as SiN, HfN, TiN, and AlN, and composite films combining the above compounds, such as ZrAlO, HfAlO, and HfSiON.

Hereinafter, descriptions will be made on a case where a thin film of $SiO_2$ is formed by using a silicon-containing gas as a raw material gas, ozone as an oxidizing gas, a mixed gas of argon, oxygen, and hydrogen as a plasma processing gas, and argon as a separation gas.

FIG. 11 is a diagram illustrating an example of the output of RF power in the plasma processing method of the embodiment. In FIG. 11, the horizontal axis represents time, and the vertical axis represents the output of RF power output by a RF power supply 85. Further, in FIG. 11, the solid line indicates the traveling wave power Pf sent from the RF power supply 85 to the plasma load including the antenna 83, and the broken line indicates the reflected wave power Pr from the plasma load toward the RF power supply 85.

First, the wafer W is loaded into the vacuum container 1. When the wafer W is loaded, the gate valve G is opened, and the wafer W is placed on the rotary table 2 by the transfer arm 10 via the transfer port 15 while intermittently rotating the rotary table 2. After the wafer W is placed, the transfer arm 10 is retracted to the outside of the vacuum container 1 and the gate valve G is closed.

Subsequently, preprocessing is performed. In the preprocessing, the wafer W is heated to a predetermined temperature by the heater unit 7 while rotating the rotary table 2 in a state where the inside of the vacuum container 1 is controlled to a predetermined pressure by the vacuum pump 64 and the pressure adjusting unit 65. At this time, Ar gas is supplied as the separation gas from the separation gas nozzles 41 and 42. Further, a silicon-containing gas is supplied from the first processing gas nozzle 31, ozone is supplied from the second processing gas nozzle 32, and a plasma processing gas including a mixed gas of argon, oxygen, and hydrogen is supplied from the plasma processing gas nozzles 33 to 35 at a predetermined flow rate. The controller 120 performs such a series of controls.

Subsequently, plasma is ignited (plasma ignition step S1). In the plasma ignition step S1, the parameters of the plasma source 80 are set to the plasma ignition conditions, and RF power is supplied from the RF power source 85 to the antenna 83 so as to ignite and generate plasma. The plasma ignition condition may be, for example, as illustrated in FIG. 11, a condition for supplying RF power from the RF power supply 85 to the antenna 83 without pulse modulation, that is, a condition for supplying a continuous wave (CW) of RF power. By supplying a continuous wave of RF power from the RF power supply 85 to the antenna 83 when igniting the plasma, the plasma may be easily ignited.

Subsequently, processing is performed (processing step S2). The processing step S2 is performed after the plasma ignition step S1. The timing t1 for starting the processing step S2 is determined based on at least one of the traveling wave power Pf and the reflected wave power Pr. For example, the processing step S2 may be started after the traveling wave power Pf reaches a predetermined set value and stabilizes, and the processing step S2 may be started after the reflected wave power Pr reaches a predetermined value (e.g., 100 W) or less. Further, for example, the processing step S2 may be started after the standing wave ratio (SWR) reaches a predetermined value (e.g., 1.5) or less. Further, two or more of the determination based on the traveling wave power Pf, the determination based on the reflected wave power Pr, and the determination based on the SWR may be combined with each other. The SWR is represented by the following equation (1) using the traveling wave power Pf and the reflected wave power Pr.

$$SWR = \frac{1+\sqrt{\frac{Pr}{Pf}}}{1-\sqrt{\frac{Pr}{Pf}}}$$

In the processing step S2, due to the rotation of the rotary table 2, the silicon-containing gas is adsorbed on the surface of the wafer W in the first processing area P1 and subsequently, the silicon-containing gas adsorbed on the wafer W in the second processing area P2 is oxidized by ozone. As a result, one or more molecular layers of $SiO_2$, which is a thin film component, are formed and deposited on the wafer W. When the rotary table 2 is further rotated, the wafer W reaches the plasma processing area P3, and the silicon oxide film is modified by the plasma processing. In the plasma processing area P3, a mixed gas of Ar, $O_2$, and $H_2$ is supplied as a plasma processing gas from the base nozzle 33, the outer nozzle 34, and the shaft-side nozzle 35. If necessary, the flow rate of oxygen may be lowered so that the modifying force is weaker than that of the mixed gas supplied from the base nozzle 33 in the area on the central axis where the angular velocity is slow and the amount of plasma processing tends to be large, based on the supply from the base nozzle 33. Further, in the area on the outer periphery where the angular velocity is high and the amount of plasma processing tends to be insufficient, the flow rate of oxygen may be increased so that the modifying force is stronger than that of the mixed gas supplied from the base nozzle 33. Thus, the influence of the angular velocity of the rotary table 2 may be adjusted as appropriate.

By continuing the rotation of the rotary table 2 in such a state, adsorption of the silicon-containing gas on the surface of the wafer W, oxidation of the silicon-containing gas component adsorbed on the surface of the wafer W, and plasma modification of the silicon oxide film as a reaction product are performed many times in this order. That is, the film formation process executed by the ALD method and the modification process of the formed film are performed many times by the rotation of the rotary table 2.

Further, in the processing step S2, the parameter of the plasma source 80 is changed from the plasma ignition condition to the processing condition. The processing condition may be a condition in which, for example, as illustrated in FIG. 11, the RF power supplied from the RF power supply 85 to the antenna 83 is pulse-modulated and supplied, that is, a pulsed wave (PW) of the RF power is supplied. When a pulsed wave of RF power is supplied from the RF power supply 85 to the antenna 83 in this way, the energy distribution of ions and radicals generated by decomposing the plasma processing gas may be changed by changing the on/off ratio (duty ratio) of pulse modulation. That is, the same effect as when a distance between the upper surface of the rotary table 2 and the bottom surface of the housing 90 (ceiling surface 46 of the plasma processing area P3) (hereinafter, also simply referred to as a "gap") is adjusted is obtained.

The duty ratio is represented by the ratio of the on-time Ton to the total time of the on-time Ton in which the RF power supply 85 supplies RF power to the antenna 83 and the off-time Toff in which the RF power supply 85 does not supply RF power, that is, Ton/(Ton+Toff). When changing the duty ratio, for example, the off-time Toff may be changed with the on-time Ton fixed, the on-time Ton may be changed with the off-time Toff fixed, or both the on-time Ton and the off-time Toff may be changed. The on-time Ton and the off-time Toff may be equal to or less than, for example, the relaxation time of electrons. For example, the on-time Ton may be 1 msec to 80 msec, and the off-time Toff may be 120 μsec to 20 msec. The relaxation time is also called the mean free time, and is the average time required from the collision of a molecule or a conduction electron with another atom to the next collision.

For example, when it is desired to form a dense $SiO_2$ film, the duty ratio is increased. As a result, as in the case where the gap is narrowly adjusted, the influence of modification by ions becomes larger, the shrinkage of the $SiO_2$ film proceeds, and a dense $SiO_2$ film may be formed.

Further, for example, when it is desired to suppress the oxidation of the substrate (e.g., a silicon substrate), the duty ratio is lowered. As a result, as in the case where the gap is widely adjusted, the influence of the modification by radicals becomes larger and the $SiO_2$ film may be formed while suppressing the oxidation of the base.

By repeating such a film forming process and a modification process, after the film thickness of the silicon oxide film reaches the target film thickness (time t2), the supply of RF power from the RF power supply 85 to the antenna 83 is stopped. In addition, the supply of the silicon-containing gas, ozone gas, and plasma processing gas is stopped. After that, after the rotation of the rotary table 2 is stopped, the processed wafer W is unloaded from the vacuum container 1 and the processing is completed.

As described above, according to the plasma processing method of the embodiment, while rotating the rotary table 2, the plasma processing gas is supplied into the vacuum container 1 and the pulsed wave of RF power is supplied to the antenna 83. Thus, the energy distribution of ions and radicals generated by decomposing the plasma processing gas may be changed by changing the duty ratio of the pulsed wave. That is, the same effect as when the distance between the upper surface of the rotary table 2 and the bottom surface of the housing 90 (ceiling surface 46 of the plasma processing area P3) is adjusted is obtained. As a result, the film quality of the $SiO_2$ film may be controlled without changing the shape of the apparatus.

In the above plasma processing method, descriptions have been made on a case where the RF power supplied from the RF power supply 85 to the antenna 83 is pulse-modulated and supplied at regular intervals over the entire period of the processing step S2, but the present disclosure is not limited thereto.

For example, the duty ratio of the pulsed wave of the RF power supplied from the RF power supply 85 to the antenna 83 may be changed in the middle of the processing step S2. As an example, a pulsed wave of RF power is supplied at the first duty ratio during a first predetermined period of the processing step S2, and the pulsed wave of RF power may be supplied at a second duty ratio higher than the first duty ratio during the remaining period. As a result, the $SiO_2$ film may be formed while suppressing the oxidation of the substrate in the first predetermined period, and a dense $SiO_2$ film may be formed in the remaining period. That is, in the processing step S2, a dense $SiO_2$ film may be formed while suppressing the oxidation of the substrate.

Further, for example, the RF power supplied from the RF power supply 85 to the antenna 83 in the processing step S2 may be switched between the pulsed wave and the continuous wave. As an example, a pulsed wave of RF power is supplied during the first predetermined period of the processing step S2, and a continuous wave of RF power may be supplied during the remaining period. As a result, the $SiO_2$ film may be formed while suppressing the oxidation of the substrate in the first predetermined period, and a dense $SiO_2$ film may be formed in the remaining period. That is, in the processing step S2, a dense $SiO_2$ film may be formed while suppressing the oxidation of the substrate.

[Evaluation Results]
(Substrate Oxidation Amount)

First, the oxidation amount on the surface of the silicon substrate is evaluated when the silicon substrate is subjected to plasma processing by the above-mentioned plasma processing method using the above-mentioned plasma processing apparatus. Further, as a reference example, the oxidation amount on the surface of the silicon substrate is evaluated when the silicon substrate is subjected to plasma processing by the above-mentioned plasma processing method using a plasma processing apparatus having a gap different from that of the above-mentioned plasma processing apparatus. The gap of the above-mentioned plasma processing apparatus is 30 mm, and the gap of the plasma processing apparatus of the comparative example is 120 mm. The conditions (processing conditions) of the processing step S2 in the plasma processing method are as follows.

<Processing Conditions>
Wafer temperature: 400° C.
Pressure in the vacuum container 1: 1.8 to 2.0 Torr
RF power: pulsed wave (output: 1,500 W, 2,000 W, 3,000 W, 4,000 W)
Duty ratio: 100%, 66.7%

Figure 12:
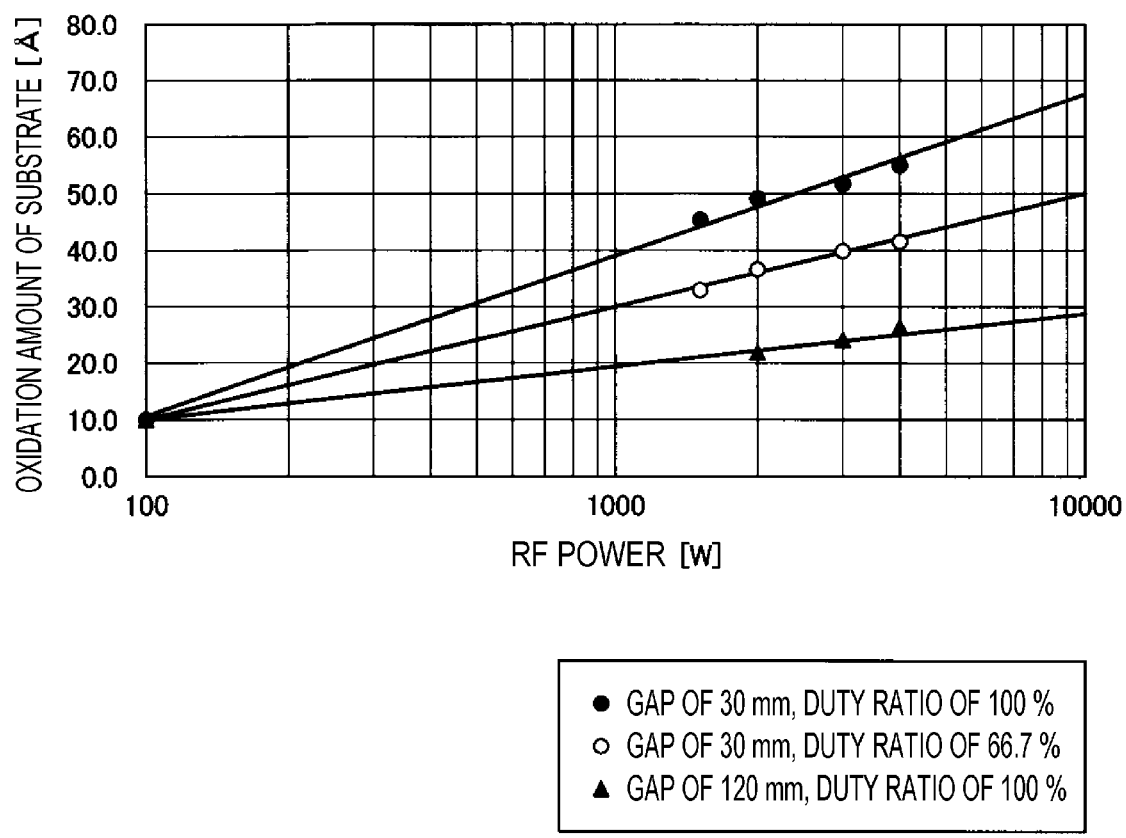
FIG. 12 is a diagram illustrating an evaluation result of an oxidation amount of a silicon substrate.

First processing gas nozzle 31: unused (no supply of first processing gas)
Second processing gas nozzle 32: unused (no supply of second processing gas)
Plasma processing gas nozzles 33, 34, and 35: Ar, $O_2$, and $H_2$
Rotation speed of rotary table 2: 120 rpm
Processing time: 5 minutes FIG. 12 is a diagram illustrating an evaluation result of an oxidation amount of a silicon substrate. In FIG. 12, the horizontal axis represents the RF power [W], and the vertical axis represents the oxidation amount [Å] of the silicon substrate. Further, in FIG. 12, the black circle (●) mark indicates that the plasma processing apparatus (having a gap of 30 mm) of the embodiment is used, and represents the result when a pulsed wave (continuous wave) having a duty ratio of 100% is used as the RF power in the processing step S2. The white circle (●) mark indicates that the plasma processing apparatus (having a gap of 30 mm) of the embodiment is used, and represents the result when a pulsed wave having a duty ratio of 66.7% is used as the RF power in the processing step S2. The black triangle (▲) mark indicates that the plasma processing apparatus (having a gap of 120 mm) of the reference example is used, and represents the result when a pulsed wave (continuous wave) having a duty ratio of 100% is used as the RF power in the processing step S2.

As illustrated in FIG. 12, it may be seen that when the gap is 30 mm, the oxidation amount of the silicon substrate is reduced by reducing the duty ratio from 100% to 66.7% regardless of the output of RF power. Further, it may be seen that when the duty ratio is 100%, the oxidation amount of the silicon substrate is reduced by widening the gap from 30 mm to 120 mm regardless of the output of RF power. From these results, it may be said that the same effect as when the gap is adjusted is obtained by supplying a pulsed wave of RF power from the RF power supply 85 to the antenna 83 and changing the duty ratio of the pulsed wave. For example, the same effect as in the case of widening the gap is obtained by reducing the duty ratio, and the same effect as in the case of narrowing the gap is obtained by increasing the duty ratio. In this way, by supplying a pulsed wave of RF power from the RF power supply 85 to the antenna 83 and changing the duty ratio of the pulsed wave, the oxidation amount of the substrate (silicon substrate) may be controlled without changing the shape of the apparatus.

Next, the shrinkage amount of the silicon oxide film is evaluated when the silicon oxide film formed on the silicon substrate is subjected to plasma processing by the above-mentioned plasma processing method using the above-mentioned plasma processing apparatus (having a gap of gap 30 mm). Further, as a reference example, the shrinkage amount of the silicon oxide film is evaluated when the silicon substrate is subjected to plasma processing by the above-mentioned plasma processing method using a plasma processing apparatus having a wider gap (gap of 120 mm) than that of the above-mentioned plasma processing apparatus. The conditions (processing conditions) of the processing step S2 in the plasma processing method are as follows.

<Processing Conditions>
Wafer temperature: 400° C.
Pressure in the vacuum container 1: 1.8 to 2.0 Torr
RF power: pulsed wave (output: 1,500 W, 2,000 W, 3,000 W, 4,000 W)
Duty ratio: 100%, 66.7%
First processing gas nozzle 31: unused (no supply of first processing gas)
Second processing gas nozzle 32: unused (no supply of second processing gas)
Plasma processing gas nozzles 33, 34, and 35: Ar, $O_2$, and $H_2$
Rotation speed of rotary table 2: 120 rpm
Processing time: 1.5 minutes (90 seconds)

Figure 13:
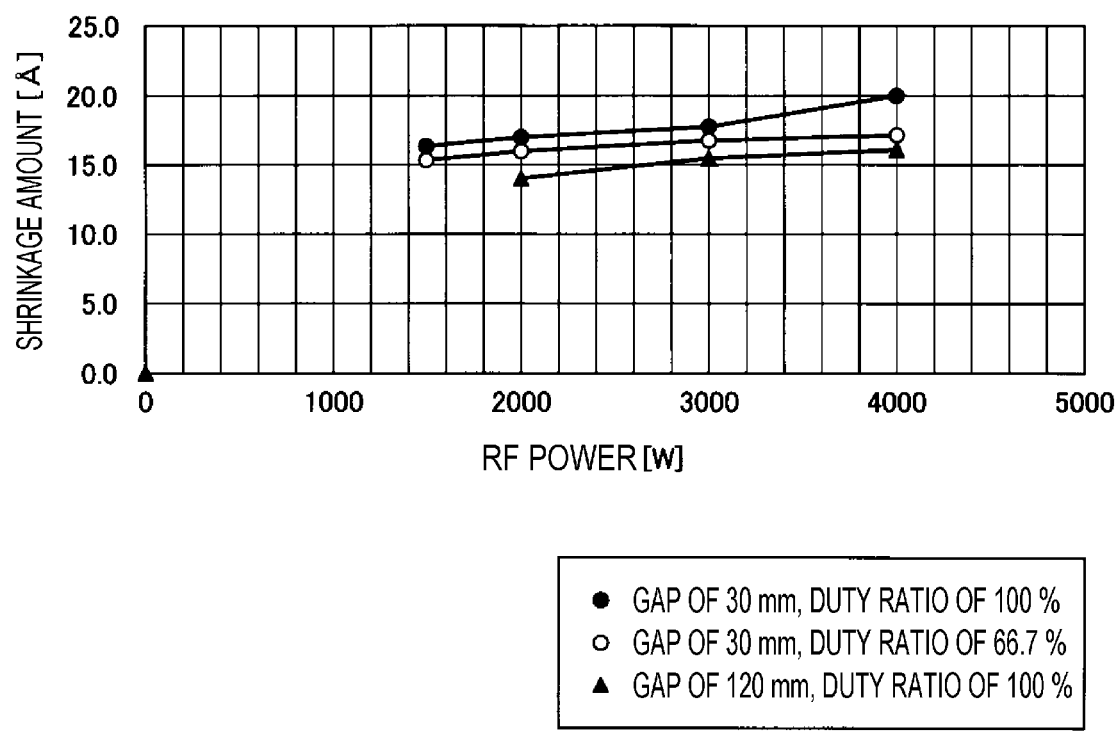
FIG. 13 is a diagram illustrating an evaluation result of a shrinkage amount of a silicon oxide film.

FIG. 13 is a diagram illustrating an evaluation result of a shrinkage amount of the silicon oxide film. In FIG. 13, the horizontal axis represents the RF power [W], and the vertical axis represents the oxidation amount [Å] of the silicon substrate. Further, in FIG. 13, the black circle (●) mark indicates that the plasma processing apparatus (having a gap of gap 30 mm) of the embodiment is used, and represents the result when a pulsed wave (continuous wave) having a duty ratio of 100% is used as the RF power in the processing step S2. The white circle (●) mark indicates that the plasma processing apparatus (having a gap of gap 30 mm) of the embodiment is used, and represents the result when a pulsed wave having a duty ratio of 66.7% is used as the RF power in the processing step S2. The black triangle (▲) mark indicates that the plasma processing apparatus (having a gap of gap 120 mm) of the reference example is used, and represents the result when a pulsed wave (continuous wave) having a duty ratio of 100% is used as the RF power in the processing step S2.

As illustrated in FIG. 13, it may be seen that when the gap is 30 mm, the shrinkage amount of the silicon oxide film is reduced by reducing the duty ratio from 100% to 66.7% regardless of the output of RF power. Further, it may be seen that when the duty ratio is 100%, the shrinkage amount of the silicon oxide film is reduced by widening the gap from 30 mm to 120 mm regardless of the output of RF power. From these results, it may be said that the same effect as when the gap is adjusted is obtained by supplying a pulsed wave of RF power from the RF power supply 85 to the antenna 83 and changing the duty ratio of the pulsed wave. For example, the same effect as in the case of widening the gap is obtained by reducing the duty ratio, and the same effect as in the case of narrowing the gap is obtained by increasing the duty ratio. In this way, by supplying a pulsed wave of RF power from the RF power supply 85 to the antenna 83 and changing the duty ratio of the pulsed wave, the shrinkage amount of the silicon oxide film may be controlled without changing the shape of the apparatus.

For example, in the processing step S2, the duty ratio of the pulsed wave of the RF power supplied from the RF power supply 85 to the antenna 83 may be changed in multiple steps or may be changed continuously.

According to the present disclosure, the film quality may be controlled without changing the shape of the apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A plasma processing method comprising:
providing a plasma processing apparatus including:
a rotary table rotatably provided in a vacuum container and configured to dispose a plurality of substrates on an upper surface thereof along a circumferential direction;
a gas supply source configured to supply a plasma processing gas to at least one of a plurality of processing areas separated by a separation area in the circumferential direction of the rotary table; and an antenna provided to face the upper surface of the rotary table and configured to generate plasma in the at least one processing area, placing the plurality of substrates on the upper surface of the rotary table;

supplying the plasma processing gas into the vacuum container and supplying a continuous wave of RF power to the antenna while rotating the rotary table; and supplying the plasma processing gas into the vacuum container and supplying a pulsed wave of RF power to the antenna while rotating the rotary table.

2. The plasma processing method according to claim 1, wherein the supplying of the pulsed wave of RF power includes:

supplying the pulsed wave of RF power to the antenna at a first duty ratio; and supplying the pulsed wave of RF power to the antenna at a second duty ratio higher than the first duty ratio.

3. The plasma processing method according to claim 2, wherein the supplying of the pulsed wave of RF power at the second duty ratio is performed after the supplying of the pulsed wave of RF power at the first duty ratio.

4. A plasma processing apparatus comprising:

a rotary table rotatably provided in a vacuum container and configured to dispose a plurality of substrates on an upper surface thereof along a circumferential direction;

a gas supply source configured to supply a plasma processing gas to at least one of a plurality of processing areas separated by a separation area in the circumferential direction of the rotary table;

an antenna provided to face the upper surface of the rotary table and configured to generate plasma in the at least one processing area; and a controller, wherein the controller is configured to execute a process including:

placing the plurality of substrates on the upper surface of the rotary table;

supplying the plasma processing gas into the vacuum container and supplying a continuous wave of RF power to the antenna while rotating the rotary table; and supplying the plasma processing gas into the vacuum container and supplying a pulsed wave of RF power to the antenna while rotating the rotary table.

* * * * *